(12) United States Patent
Rhie

(10) Patent No.: US 9,343,473 B2
(45) Date of Patent: May 17, 2016

(54) STRUCTURE AND METHOD FOR MANUFACTURE OF MEMORY DEVICE WITH THIN SILICON BODY

(71) Applicant: Conversant Intellectual Property Management Inc., Ottawa (CA)

(72) Inventor: Hyoung Seub Rhie, Ottawa (CA)

(73) Assignee: Conversant Intellectual Property Management Inc., Ottawa (CA)

(*) Notice: Subject to any disclaimer, the term of this patent is extended or adjusted under 35 U.S.C. 154(b) by 0 days.

(21) Appl. No.: 14/935,483

(22) Filed: Nov. 9, 2015

(65) Prior Publication Data

US 2016/0086959 A1  Mar. 24, 2016

Related U.S. Application Data

(62) Division of application No. 13/829,392, filed on Mar. 14, 2013, now Pat. No. 9,202,931.

(51) Int. Cl.
*H01L 21/336* (2006.01)
*H01L 27/115* (2006.01)
*H01L 29/66* (2006.01)
*H01L 21/28* (2006.01)
*H01L 21/306* (2006.01)

(52) U.S. Cl.
CPC ...... *H01L 27/1157* (2013.01); *H01L 21/28282* (2013.01); *H01L 21/30604* (2013.01); *H01L 29/66833* (2013.01)

(58) Field of Classification Search
USPC .................. 257/315, 316, 324; 438/257, 696
See application file for complete search history.

(56) References Cited

U.S. PATENT DOCUMENTS 8,319,275 B2 * 11/2012 Shim ................. H01L 27/11565
257/324
2011/0298037 A1 * 12/2011 Choe ................. G11C 16/0483
257/324
2012/0199898 A1 * 8/2012 Alsmeier .......... H01L 27/11551
257/326

* cited by examiner

*Primary Examiner* — Errol Fernandes
(74) *Attorney, Agent, or Firm* — Daniel Hammond

(57) ABSTRACT

Described herein is a structure and method of manufacturing for a memory device with a thin silicon body. The memory device may be a semiconductor comprising: a first dielectric of a first width; a second dielectric of a second width, the second width less than the first width; and a thin film polycrystalline silicon (poly-Si) on sidewalls of the second dielectric.

19 Claims, 17 Drawing Sheets

STRUCTURE AND METHOD FOR MANUFACTURE OF MEMORY DEVICE WITH THIN SILICON BODY

CROSS REFERENCE TO RELATED APPLICATIONS

This application is a divisional of U.S. application Ser. No. 13/829,392, entitled "STRUCTURE AND METHOD FOR MANUFACTURE OF MEMORY DEVICE WITH THIN SILICON BODY", filed on Mar. 14, 2013, which is incorporated herein by reference in its entirety.

BACKGROUND

Semiconductors may be configured as nonvolatile memory such as, for example, a flash memory device. Flash memory may comprise NAND flash memory and/or other types of flash memory. Flash memory is a commonly used type of nonvolatile memory in widespread use as mass storage for consumer electronics, such as digital cameras and portable digital music players. Such flash memories may take the form of memory cards or USB type memory sticks, each may have at least one memory device and a memory controller formed therein.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that although illustrative implementations of one or more embodiments of the present disclosure are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

A VG NAND structure may be formed by stacking two layers comprising a first and a second dielectric material. The first dielectric may be etched on its sidewalls, resulting in an alternating recessed sidewall pattern. A thin film poly-Si may be deposited in the recessed portions. The two dielectric materials may have two different k-values whereby the first dielectric material may have a lower k-value than the second dielectric material.

Organization of a NAND Flash Memory Cell Array

Figure 1:
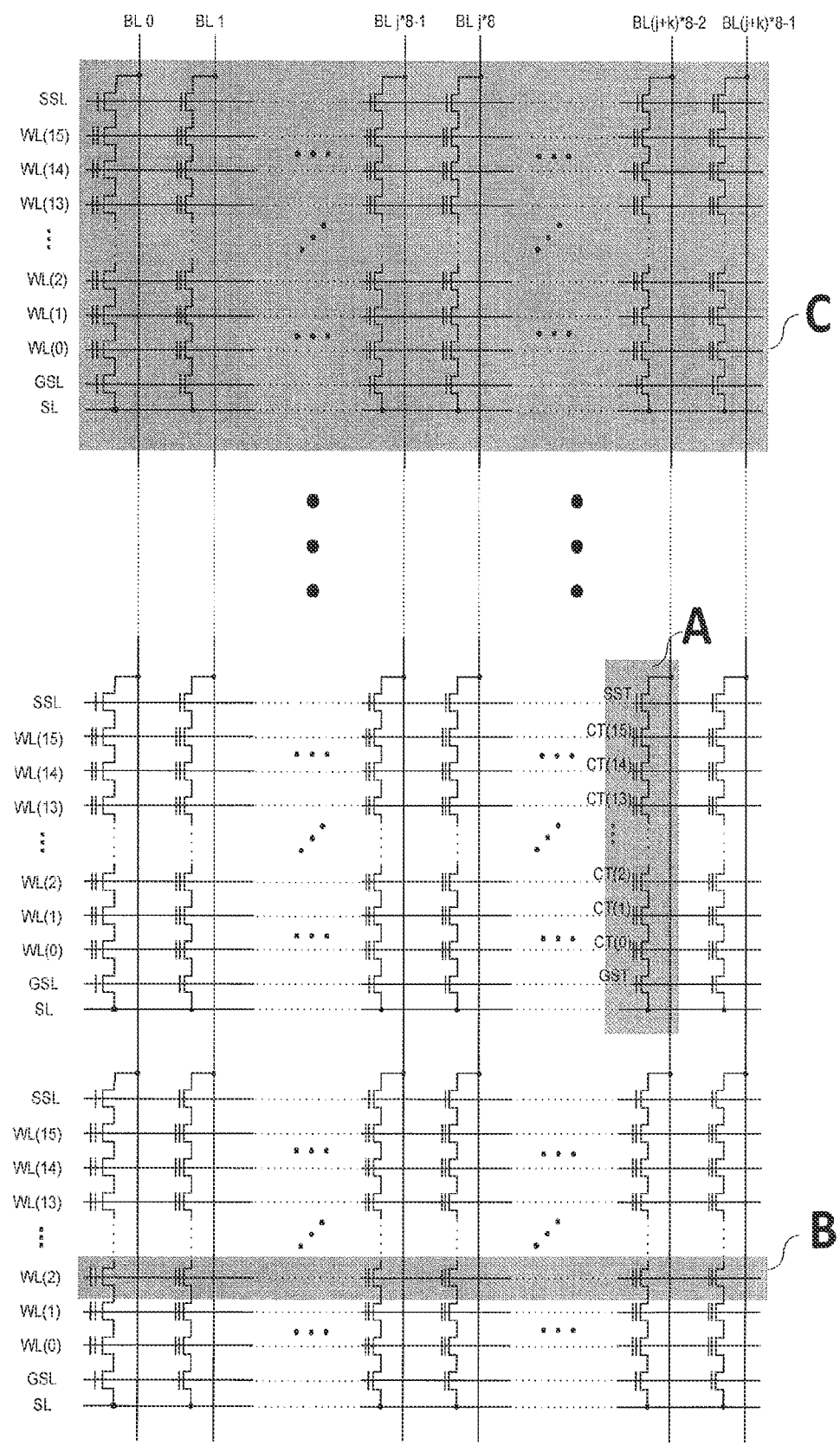
FIG. 1 is a diagram of a NAND flash array

FIG. 1 is a diagram of a NAND flash array. A NAND cell string as illustrated in the shaded box "A" of FIG. 1 may consist of at least one string select transistor (SST) which may be placed in series with the cell transistors and with one terminal (hereinafter referred to as the drain) being connected to the bit line. A NAND cell string may also contain a certain number of memory cell transistors (CT) and at least one ground select transistor (GST) which may be serially connected between the cell transistors and the source line. Although the string illustrated in FIG. 1 consists of 16 cells, the present embodiments are not restricted to any specific number of cells per string. The number of cells per string may vary, with 4 cells per string, 8 cells per string, 32 cells per string, 64 cells per string, 128 cells per string or any other number greater than 1 also being possible embodiments. Memory cell gates in FIG. 1 may be coupled to word lines (WL) 0 to 15. The gate of the string select transistor (SST) may be connected to a string select line (SSL) while the drain of the string select transistor (SST) may be connected to a bit line (BL). The gate of the ground select transistor (GST) may be connected to a ground select line (GSL) while the source of the ground select transistor (GST) may be connected to a source line (SL or CSL). To specify a direction within a string, the direction towards the SSL of a string will be referred to herein as "drain direction" or "drain side" and the direction towards the GSL of a string will be referred to herein as "source direction" or "source side".

The shaded box "B" in FIG. 1 illustrates an embodiment of a page in a NAND Flash device. A page may be the smallest unit addressed by a row address. The smallest unit for which a read or program operation may be performed may also be one page. In some embodiments one page may be identical to all cells connected to one word line. However, in other embodiments cells connected to a certain word line may be subdivided into multiple subgroups which may constitute multiple pages per word line, whereby each one of the multiple pages in one word line has a different row address. In the case of multiple bit storage in one physical cell, different bits may belong to different pages although they may be physically located in the same cell transistor and thus connected to the same word line.

The shaded box "C" in FIG. 1 illustrates a cell block. The cell block may be constituted by the entirety of strings which share the same word lines, string select lines, and ground select lines. In some embodiments of NAND Flash memory devices, the smallest unit for which an erase operation may be performed is one cell block, which is therefore often referred to as "erase block".

Figure 2:
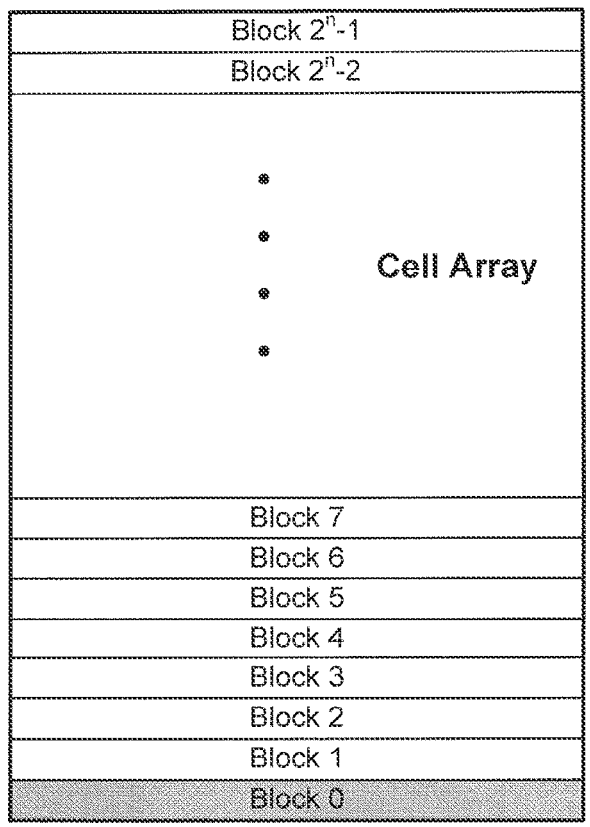
FIG. 2 is diagram of a NAND flash cell array.
Figure 3:
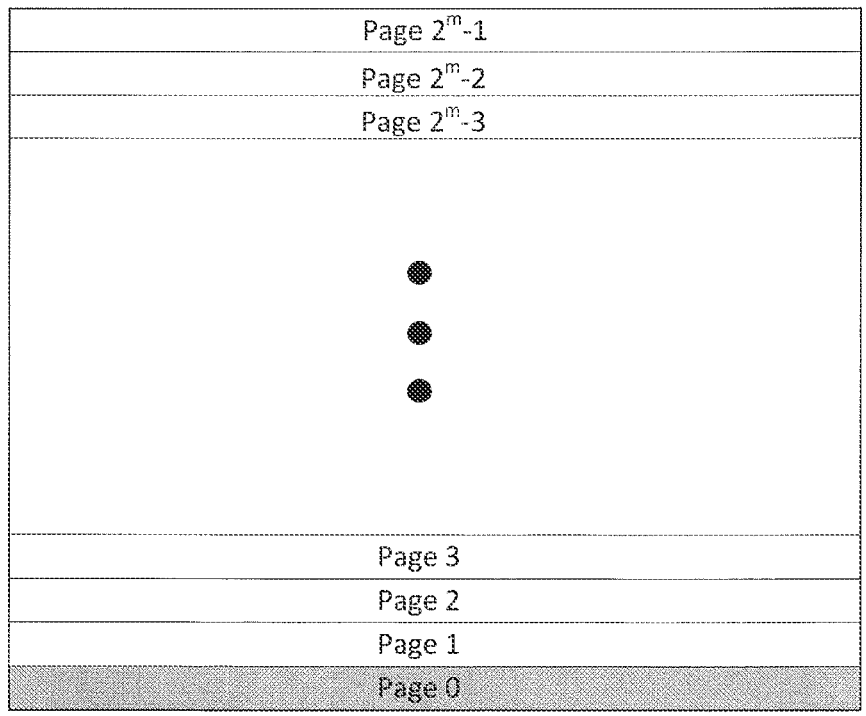
FIG. 3 is a diagram of a NAND flash block.

FIG. 2 is diagram of a NAND flash cell array. FIG. 3 is a diagram of a NAND flash block. Assuming that a row address is made of n bits for the block address and m bits for the page address, FIG. 2 illustrates the cell array structure of NAND flash memory, comprising $2^n$ erase blocks, with each block subdivided into $2^m$ programmable pages as shown in FIG. 3.

Figure 4:
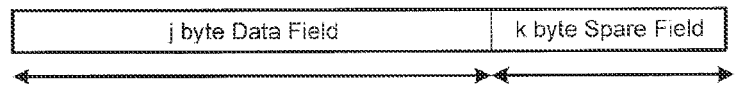
FIG. 4 is a diagram of a NAND flash page.

FIG. 4 is a diagram of a NAND flash page. Each page may consist of (j+k) bytes (times 8 bits) as shown in FIG. 4. The pages may be further divided into a j-byte data storage region (data field) with a separate k-byte area (spare field). The k-byte area may be used for error management functions.

Basic Cell Operation of Erase, Program and Read

Figure 5:
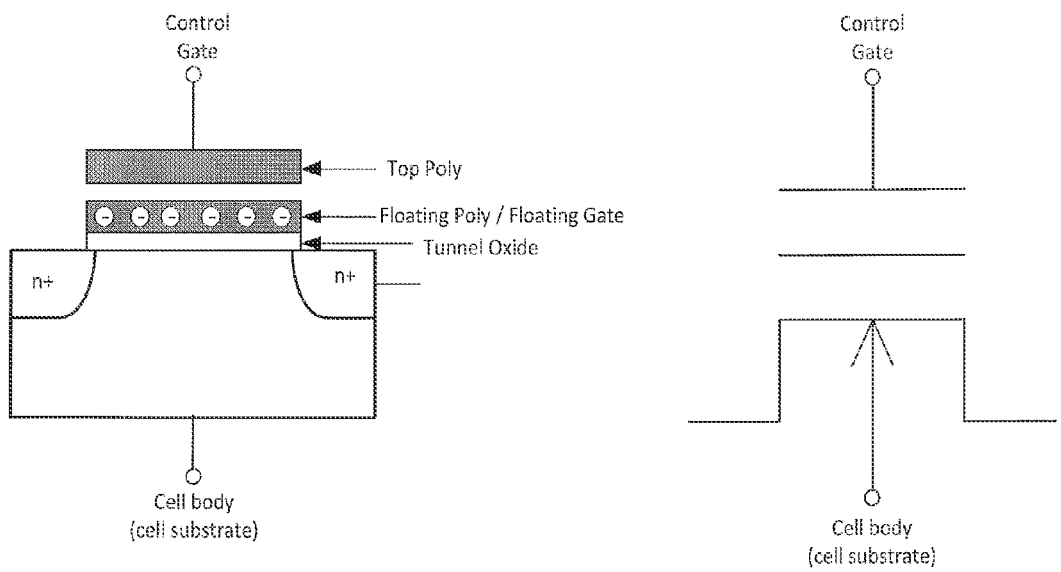
FIG. 5 is a diagram of a NAND flash cell transistor

FIG. 5 is a diagram of a NAND flash cell transistor. NAND flash cell transistors may store information by trapping electrons in a floating node either by a technology referred to as "floating gate" or by a technology referred to as "charge trap". The electrons trapped in the floating node of a cell transistor may modify the threshold voltage of the cell transistor to different levels depending on the data (0 or 1) stored in the cell. The threshold voltage of the cell transistor may influence the channel resistance of the cell transistor.

Figure 6:
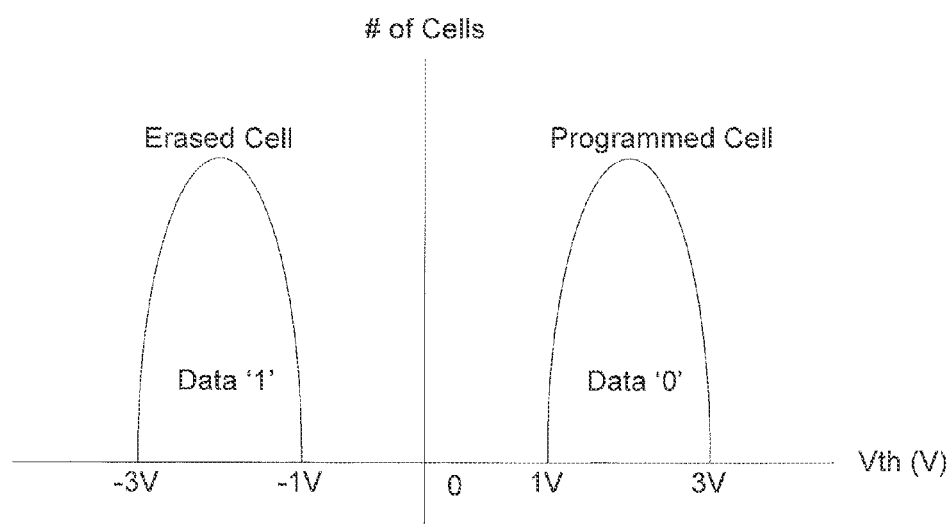
FIG. 6 is a diagram of a cell threshold voltage distribution for single level cells.

FIG. 6 is a diagram of a cell threshold voltage distribution for single level cells. In some embodiments memory cells may store two logic states; data '1' and data '0' and each memory cell may correspond to one bit. In this case the flash memory cell may have one of two threshold voltages corresponding to data '1' and data '0'. An embodiment of the cell threshold voltage distribution for single level cells (SLC) is shown in FIG. 6.

Figure 7:
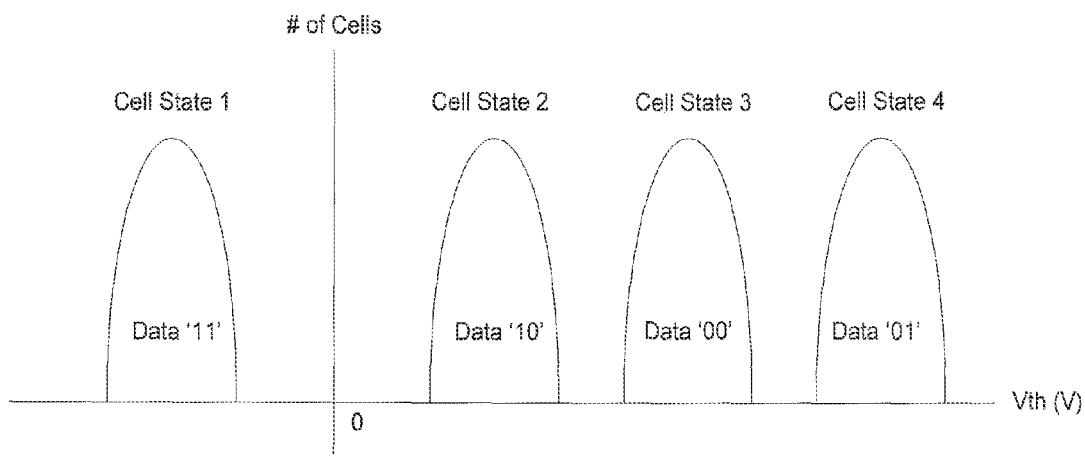
FIG. 7 is a diagram of a cell threshold distribution for multi-level cells.

FIG. 7 is a diagram of a cell threshold distribution for multi-level cells. In some NAND Flash devices cells may also be programmed to more than two threshold levels and thus multiple bits may be stored in one physical cell as depicted in FIG. 7, which may be referred to as multi-level cells (MLC). Embodiments described herein may apply equally to NAND memory devices with single and multiple bit storage per cell.

Figure 8:
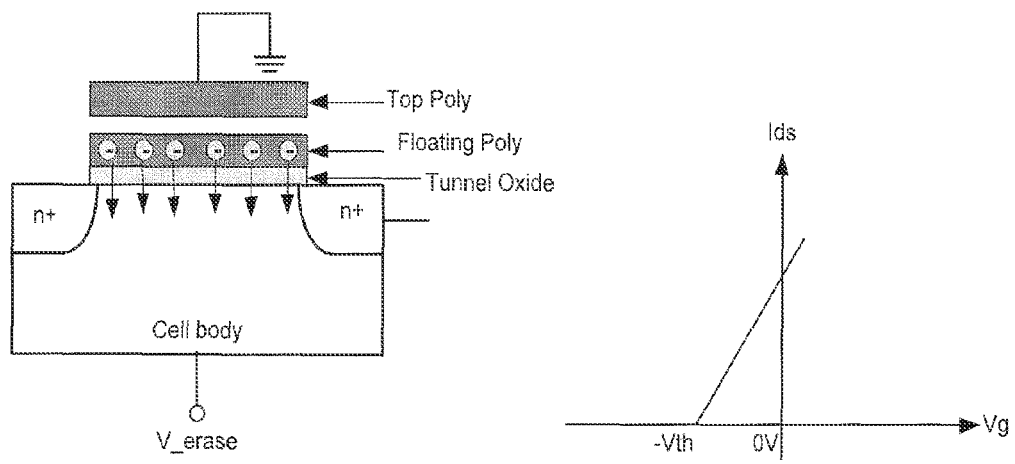
FIG. 8 is a diagram of an erase operation by Fowler-Nordheim (F-N) tunneling.

FIG. 8 is a diagram of an erase operation by Fowler-Nordheim (F-N) tunneling. In some embodiments, a NAND flash memory cell may be erased and programmed by Fowler-Nordheim (F-N) tunneling. During an erase operation, the top poly electrode (i.e. top gate) of the cell may be biased to Vss (ground) while the cell body may be biased to an erase voltage V_erase and the source and drain of the cell may be floated (in the case that the source and the drain consist of N+ diffusion layers they are automatically biased to V_erase due to junction-forward-bias from the cell body to the source/drain). With this erase bias condition, trapped electrons (charge) in the floating poly (i.e. floating gate) may be emitted uniformly to the substrate through the tunnel oxide as shown in FIG. 8. The cell threshold voltage (Vth) of the erased cell may become negative as also shown in FIG. 8. In other words, the erased cell transistor may be in an on-state with a gate bias Vg of 0V.

Figure 9:
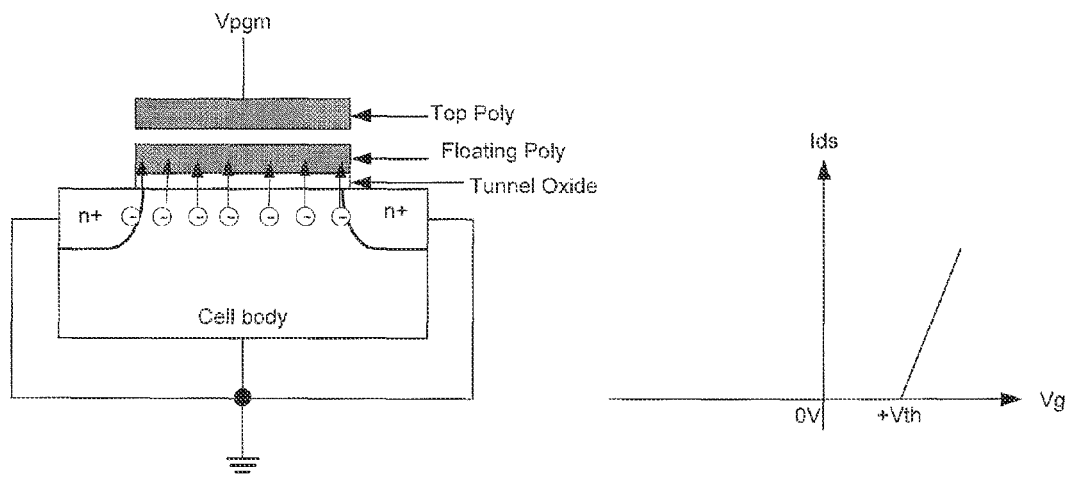
FIG. 9 is a diagram of a program operation by Fowler-Nordheim (F-N) tunneling.

FIG. 9 is a diagram of a program operation by Fowler-Nordheim (F-N) tunneling. During program operation the top poly (i.e. top gate) of the cell may be biased to a program voltage Vpgm while the substrate, source, and drain of the cell may be biased to Vss (ground). More precisely, the high Vpgm voltage (e.g. 20V) may induce a channel under the tunnel oxide. Since this channel is electrically connected to the source and drain which are tied to Vss=0V, the channel voltage Vch is also tied to ground. By the difference in voltage Vpgm–Vch, electrons from the channel may be uniformly injected to the floating poly (floating gate) through the tunnel oxide as shown in FIG. 9. The cell threshold voltage Vth of the programmed cell becomes positive as also shown in FIG. 9. In other words, the programmed cell may be turned off with a gate bias Vg of 0V.

Figure 10:
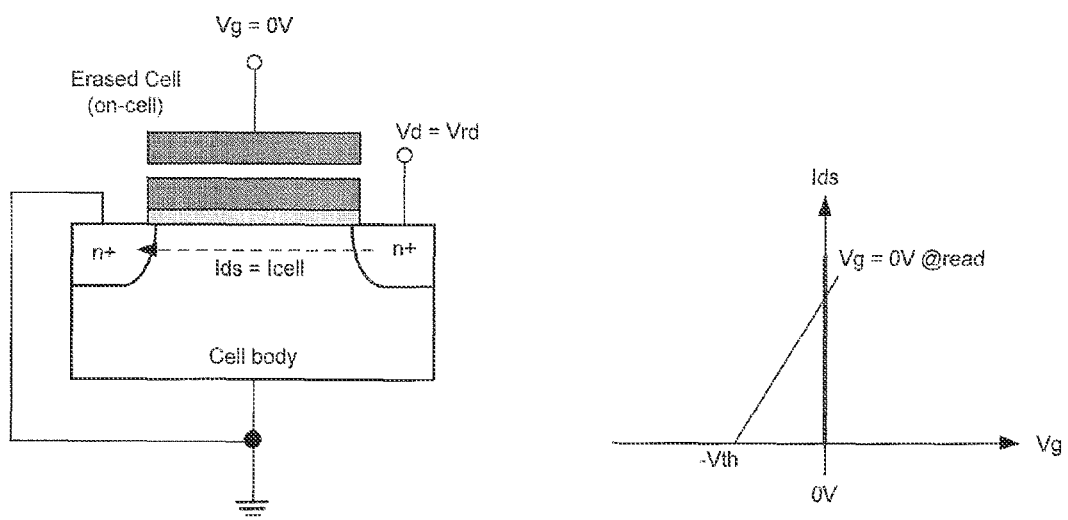
FIG. 10 is a diagram of a read operation of erased data.
Figure 11:
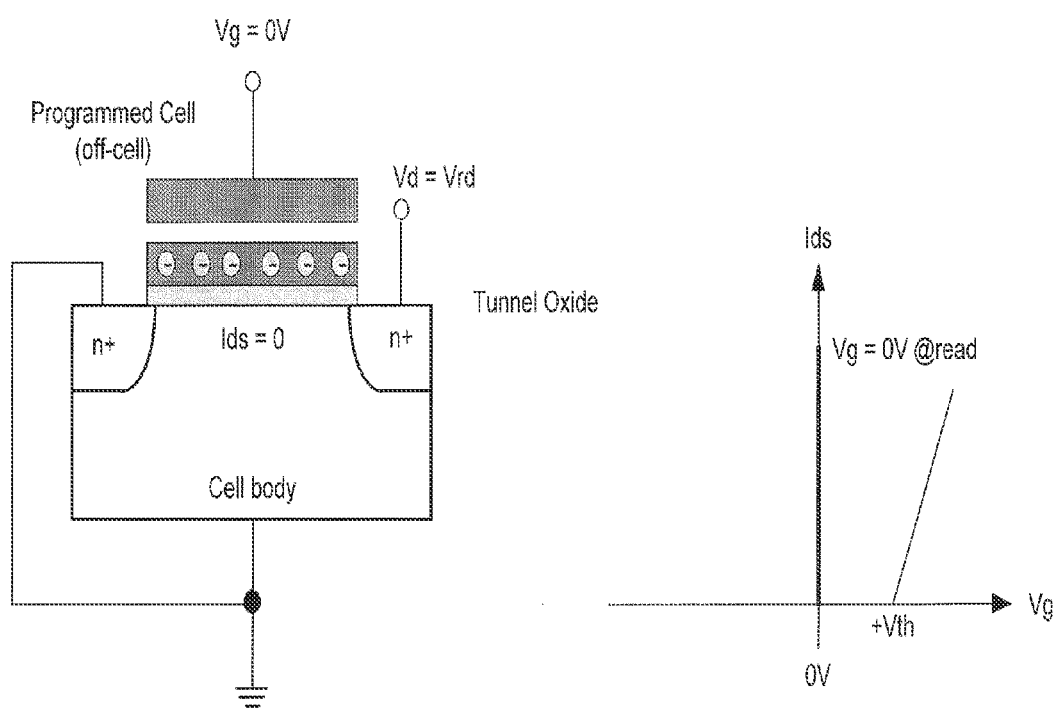
FIG. 11 is a diagram of a read operation of a programmed cell.

FIG. 10 is a diagram of a read operation of erased data. FIG. 11 is a read operation of a programmed cell. In order to read cell data, the gate and drain of the selected cells may be biased to 0V and a read voltage Vrd, respectively while the source of the selected cells may be set to 0V. If the cell is in an erased state as shown in FIG. 10, the erased cell may have a negative threshold voltage and thus a cell current (Icell) from the drain to the source flows under the given bias condition. Similarly if the cell is in a programmed state as shown in FIG. 11, the programmed cell may have a positive threshold voltage and there is no cell current from the drain to the source under the given bias condition. A sense amplifier connected to each bit line may sense and latch cell data; an erased cell (on-cell) may be sensed as data '1' and a programmed cell (off-cell) may be sensed as data '0'.

Figure 12:
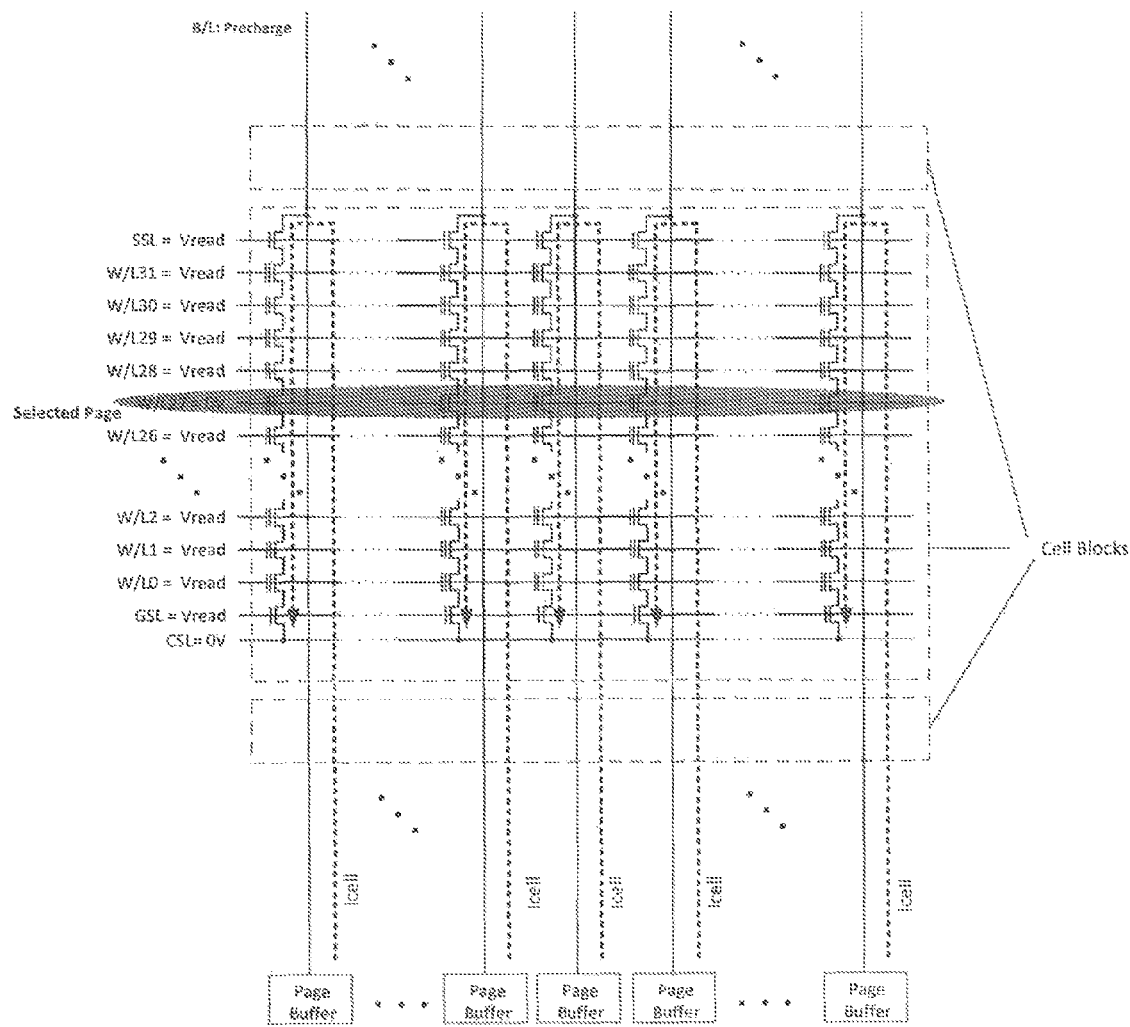
FIG. 12 is a diagram of bias conditions during page read operations

FIG. 12 is a diagram of bias conditions during page read operations. The selected word line may be set to 0V while unselected word lines, SSL, and GSL may be biased to a read pass voltage Vread that is sufficiently high to render unselected cell transistors conductive regardless of their programmed state (i.e. cell Vth). The common source line CSL may be set to ground. With read bias conditions, the Vth of the selected cell may determine cell current Icell. This cell current Icell may be sensed by a bit line sense amplifier in a page buffer. An entire page may be read in parallel. In order for a read operation to work without disturbance, the source line may need to be solidly tied to ground without any modification by the cell currents.

Figure 13:
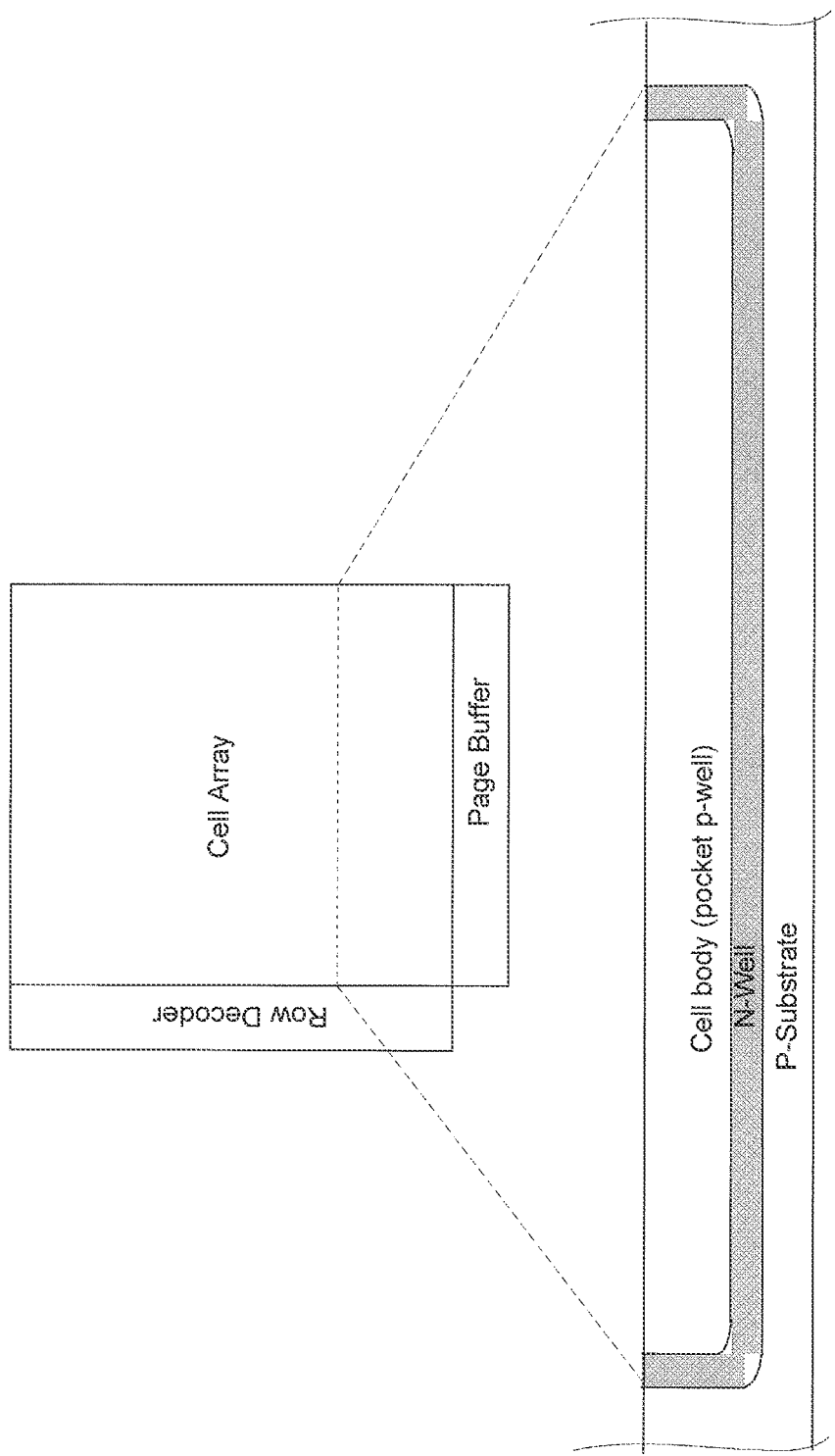
FIG. 13 is a diagram of a cell substrate

FIG. 13 is a diagram of a cell substrate. The bias conditions of various nodes in the cell array including the cell body will be described. A detailed description can also be found in, for example, U.S. Pat. No. 5,473,563 in which non-volatile semiconductor memories using arrays of cell units include memory transistor divided into several memory blocks, each having certain number of cell units, with erasable selectable memory blocks. FIG. 13 shows an example structure of a cell array substrate that may be used in NAND Flash devices. The cell body may be formed by a pocket p-well which may be isolated from the p-substrate of the chip.

Figure 14:
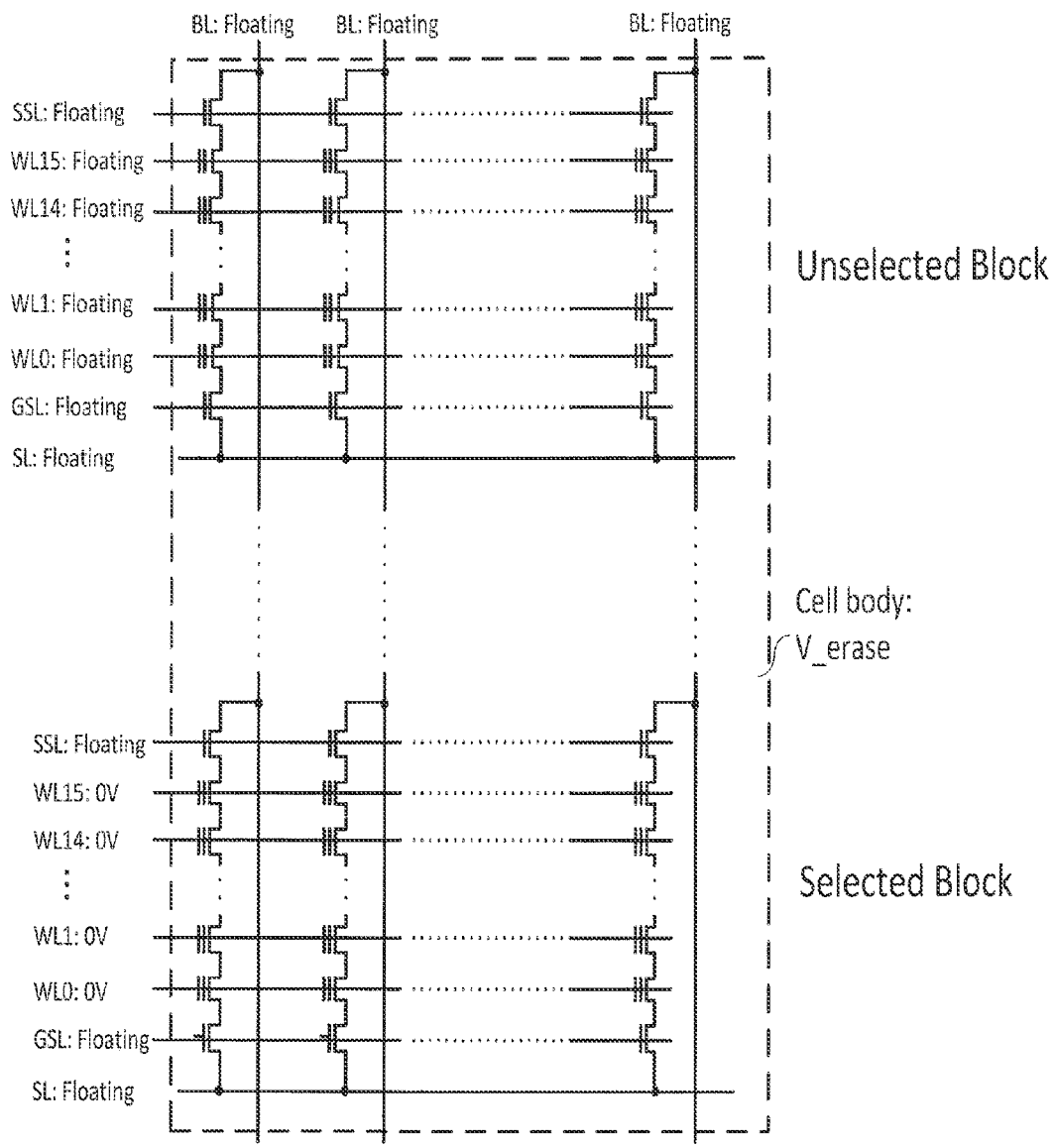
FIG. 14 is a diagram of bias conditions during erase for a selected and unselected block.

FIG. 14 is a diagram of bias conditions during erase for a selected and unselected block. Table 1 shows bias conditions that may exist during erase operations in some embodiments. The cell body may be biased to the erase voltage V_erase (usually a high voltage 18~20V) while the floating bit lines and the source lines (SL) in the selected block may be clamped to V_erase-0.6V through the forward biased source/drain junctions of the SSL and GSL transistors. At the same time all word lines in the selected block may be biased to 0V while the string select line (SSL) and the ground select line (GSL) may be biased to erase voltage V_erase. Therefore all cells within the selected block may be erased by F-N tunneling as described above. Because the substrate of the cells may be biased to erase voltage V_erase and the source/drain/substrate of cells in the selected block may be electrically connected, the erase operation occurs on a block basis. In other words, the minimum erasable array size may be a block.

Because of the block basis erase operations, erasure of memory cells in unselected blocks sharing the same cell substrate must be prevented (i.e. erase inhibit). For this purpose the self-boosting erase inhibit scheme has been proposed. To prevent erasure of memory cells in unselected blocks, all word lines in unselected blocks may be floated during erase operations. Therefore floated word lines in unselected blocks may be boosted to nearly erase voltage level V_erase by capacitive coupling between the substrate and word lines, the value may depend on the coupling ratio to the word line level and may lie around 90% of V_erase when the substrate of the cell array goes to V_erase. The boosted voltage of the word lines in unselected blocks may reduce the electric field between the cell substrate and word lines. As a result erasure of memory cells in unselected blocks may be prevented. The bias conditions described herein are used for examples. Variations may exist for specific cell technologies, especially vertically stacked cell technologies.

TABLE 1

| | Selected Block | Unselected Block |
|---|---|---|
| Bitlines (BL) | Clamped to V_erase-0.6 V | Clamped to V_erase-0.6 V |
| String Select Line (SSL) | Boosted to approx. 90% of V_erase | Boosted to approx. 90% of V_erase |
| Wordlines (WL0 ~ WL15) | 0 V | Boosted to approx. 90% of V_erase |
| Ground Select Line (GSL) | Boosted to approx. 90% of V_erase | Boosted to approx. 90% of V_erase |
| Source Line (SL) | Clamped to V_erase-0.6 V | Clamped to V_erase-0.6 V |
| Cell body | V_erase | V_erase |

Page Program and Program Inhibit

The program operation of a single cell was described above, where it was described that a high program voltage Vpgm may be applied to the control gate, whereas the channel voltage Vch under the tunnel oxide of the cell transistor may be tied to the ground level Vss. Cells which are intended to be programmed during program operation may be referred to as "program cells" or "selected cells" hereinafter.

A string to which a cell to be programmed during program operation belongs will be referred to as a "selected string" or "program string", and bit lines which are connected to such strings will be referred to as "program bit lines" or "selected bit lines" hereinafter. Strings of which the cells should not be programmed during the program operation will be referred to as "unselected strings" or "program inhibited strings", and bit lines which are connected to such strings will be referred to as "program inhibit bit lines" or "unselected bit lines" hereinafter.

A string to which a cell to be programmed during program operation belongs will be referred to as a "selected string" or "program string", and bit lines which are connected to such strings will be referred to as "program bit lines" or "selected bit lines" hereinafter. Strings of which the cells should not be programmed during the program operation will be referred to as "unselected strings" or "program inhibited strings", and bit lines which are connected to such strings will be referred to as "program inhibit bit lines" or "unselected bit lines" hereinafter.

Figure 15:
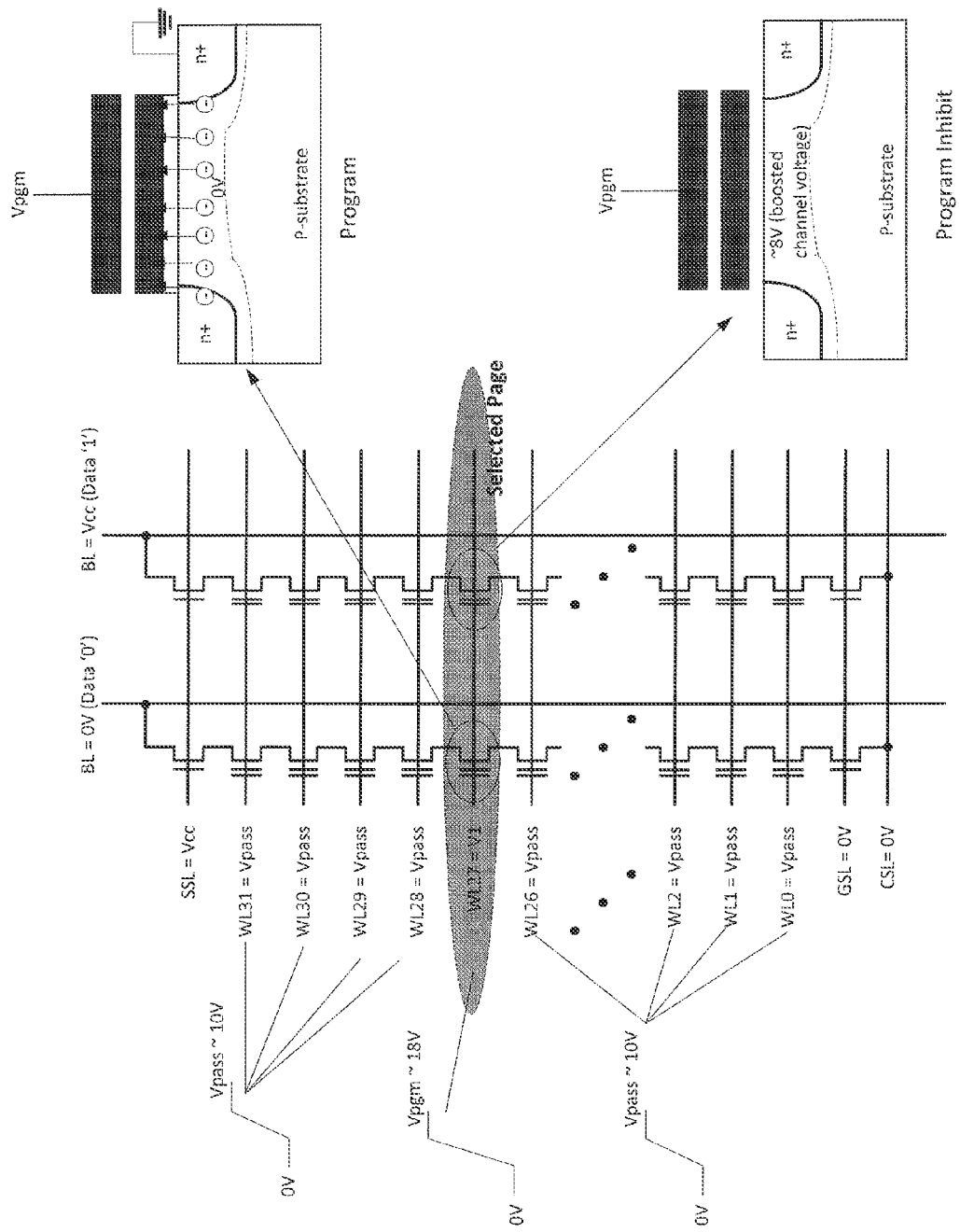
FIG. 15 is a diagram of page program bias conditions

FIG. 15 is a diagram of page program bias conditions. One embodiment of a channel self-boosting program inhibit scheme is described below in conjunction with FIG. 15. The program voltage Vpgm may be applied to the control gate of a selected cell through the word line to which the program cell is connected. For brevity this word line will be referred to as the "selected word line" hereinafter. The strings select transistor (SST) of the selected string may be turned on with Vcc applied to the SSL and the ground select transistor GST turned off. The bit line voltage for a selected cell to be programmed with data "0" may be set to Vss=0 V. Thus, the ground level Vss may be supplied to the channel of the selected cell through the program bit line and the strings select transistor SST to which this particular string is connected to and through the serially connected cell transistors on the drain side of the selected cell between the selected cell and the SSL. These "drain side" cells may be in a turned-on state with Vpass applied to their control gates to be able to pass on the channel voltage Vss. For another reason related to program inhibit described below, source side cells may also be turned on with Vpass applied to their control gates. A continuous channel may be formed from the bit line to the selected cell (and beyond) with a channel voltage Vch of 0V. When the program voltage Vpgm is applied to the gate of a selected cell, the large potential difference between gate and channel level Vch may result in F-N tunneling of electrons into the floating gate.

For program inhibited cells (i.e. cells which should stay in an erased state with data '1') and program inhibited strings the connected program inhibit bit line may be set to Vcc. For program inhibit, the bit line level of Vcc may initially precharge the associated channel through the turned on SST transistor, the gate of which may be biased also with Vcc as it is connected to the same SSL which also turns on the SST transistors of program strings. The coupled channel voltage rises, and once the channel voltage reaches Vcc-Vth (SSL) the SST transistor may shut off and the string channel of the program inhibit string becomes a floating node.

Once the word lines of the unit string rise during program operation (selected word line to the program voltage Vpgm and unselected word lines to the pass voltage Vpass), the series capacitances through the control gate, floating gate, channel, and bulk may be coupled and the channel potential Vch may be boosted automatically beyond the precharge level of Vcc-Vth(SSL). Hereby the word lines on the source side of the selected cell may also be raised to Vpass to participate in the channel-boosting. The floating channel voltage may rise to approximately 80% of the gate voltage. Thus, the channel voltages of program inhibited cells may be boosted to approximately 8 V in the case that Vpgm~15.5-20 V and Vpass~10 V are applied to the control gates. This high channel voltage may prevent F-N tunneling in the program inhibited cells.

Figure 16:
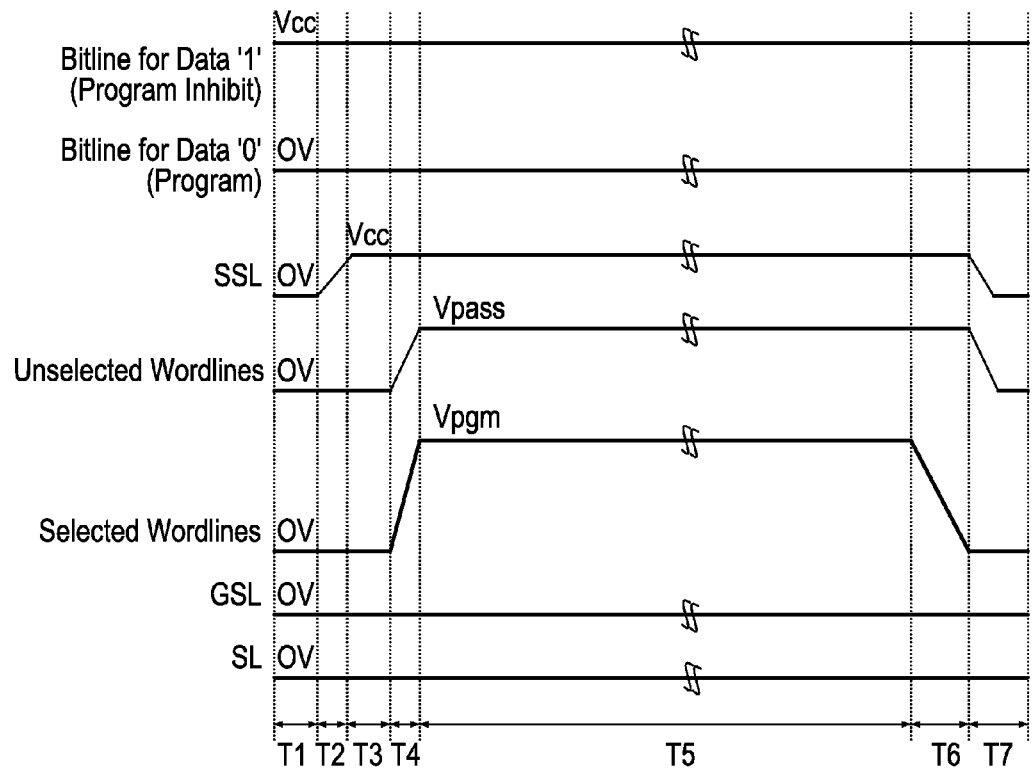
FIG. 16 is a diagram of program timing

FIG. 16 is a diagram of program timing. FIG. 16 shows an example of the timing of the voltages during program operation. Numerous variations of this program timing scheme exist including the application of multiple pulses for Vpgm and Vpass. While one example of program timing is given in FIG. 16, the claimed embodiments are not restricted to any program timing scheme in particular.

Vertical Cell Transistors

Figure 17:
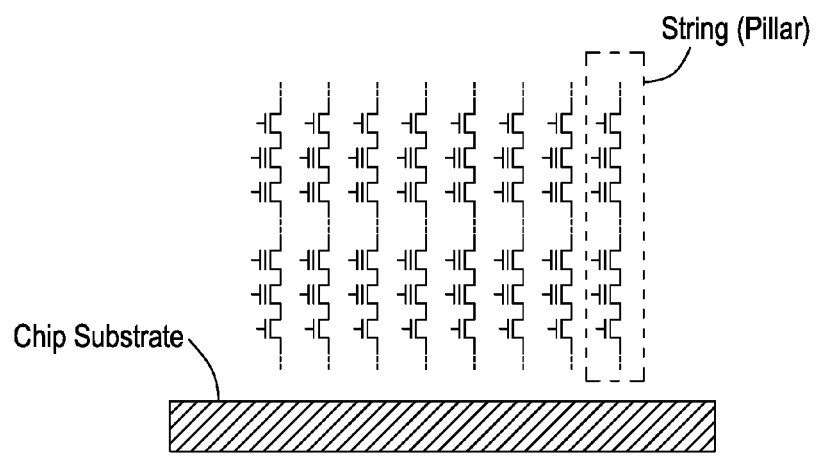
FIG. 17 is a diagram of vertical NAND cells with strings running perpendicular to a chip substrate.
Figure 18:
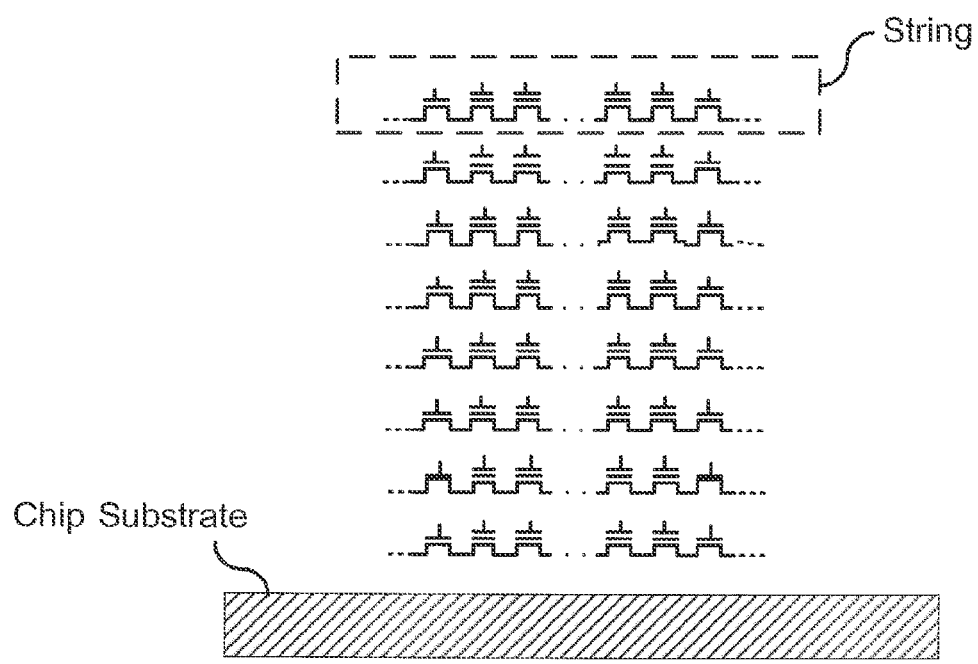
FIG. 18 is a diagram of vertical NAND cells with strings running parallel to a chip substrate.

The desire to reduce manufacturing costs per data bit may lead the NAND Flash industry continuously to reduce the size of the cell transistors. Due to the limitations imposed by photolithography tools and the limits of shrinking the physical transistor size, NAND cells may be stacked in a direction perpendicular to the chip surface. Thereby the effective chip area per data bit may be reduced without relying on the shrinkage of the physical cell transistor size. Some of the embodiments disclosed herein may apply specifically to vertically stacked NAND Flash transistor cells. From a geometrical point of view two different types of stacked NAND devices may be used: 1) cell strings run in a direction perpendicular to the chip substrate, as shown in FIG. 17, whereby cells which belong to the same string may be stacked vertically on top of each other; and 2) cell strings run in a direction parallel to the chip substrate as shown in FIG. 18, whereby cells which belong to the same string may be aligned in a direction parallel to the chip surface as in conventional NAND cells, but different strings are stacked vertically on top of each other. Flash configured in accordance to case 1 above will be referred to herein as Vertical Channel NAND or VC NAND. Flash configured in accordance to case 2 above will be referred to herein as Vertical Gate NAND or VG NAND. The claimed embodiments relate to VG NAND structures, e.g. the conductive strips which form the silicon bodies of the individual strings run as a silicon strip horizontal to the chip surface as in FIG. 18.

VG NAND offers a number of advantages over VC NAND structures. E.g. the device size at the sidewall may not be inherently affected by the etch slope and thus independent on the specific stacked layer in which the transistor is located, which means that all cell transistors in one string may be expected to have similar characteristics. Another advantage is the fact that the string length (and thus serial resistance) may not be affected by the number of stacks but is freely controllably regardless of stacking height.

Some embodiments described herein may comprise NAND cell transistors comprising n-channel transistors on p-type (or undoped) substrate. However, this is not a necessary requirement of all embodiments. For example, in some embodiments, n and p-type impurities may be interchanged so as to form p-channel transistors on n-type substrate, or the substrate may consist of undoped silicon.

VG NAND Structure with Improved Vth Uniformity

Vertically stacked NAND Flash cell transistors (VC and VG NAND) may be formed on a grown poly-silicon layer. The embodiments described herein may apply to VG NAND cell arrays which utilize grown polycrystalline silicon (poly-Si) as a channel material for the cell transistors. More specifically they may deal with the degradation of cell transistor characteristics of polycrystalline silicon (poly-Si) as compared to single-crystalline silicon. If the doping concentration is equal to or less than the trap density, the threshold voltages of the individual cell transistors may be significantly affected by traps. As the trap density increases, Vth may be completely controlled by traps within the depletion width. This causes a serious problem as the variation of Vth may be determined by the trap density which is highly variable in nature. The threshold voltage may be increased and the subthreshold characteristics may be degraded as the number of bulk traps is increased. Further, there may be a linear drop of threshold voltage and subthreshold slope with respect to the diameter of the devices (and thus the number of traps) when the device is operated in the fully depleted regime. The electrical characteristics may be improved as the diameter of the device is reduced, because the small device size may decrease the defect density in the channel. Translated to vertical NAND devices this means that it may be advantageous to reduce the thickness of the poly-Si body below the depletion width.

Some manufacturing processes of VG NAND device structure may result in bulk poly-Si strips, and the depth of the silicon body cannot easily be controlled to desirable thickness. The claimed embodiments may provide a specific structure and process which follows the common VG NAND structure in the sense defined in FIG. 18, which however realizes a reduced poly-Si body film thickness in a manufacturable way without giving up the underlying VG NAND structure.

Channel Separation for Independent Front/Back Gate Charge Storage in Dual Gate Structure Due to the dual gate geometry of VG NAND, each physical cell may in fact be spatially separated into two different storage nodes (each face of the dual gate cell transistor structure). However, in prior VG NAND dual gate devices this is not used for multiple bit storage. One major obstacle for using the dual gates as separate storage nodes for multi-bit storage may be the shared common body. NAND Flash memory cell arrays may depend on the existence of controllable inversion channels as current paths within strings which are electrically isolated from the channels of adjacent strings. If string channels of adjacent strings cannot be separated from each other, this creates parallel alternative current paths and it may not be possible to reliably measure string currents and read out the stored data.

If the silicon body is below a certain thickness, the inversion channels of the front and back gate may start to merge into each another and therefore cannot act as separate current paths of separate strings sharing the same body. Another obstacle to using front/back gates of dual gate NAND structures as independent storage sites may be that the threshold voltage Vth of the front gate depends on the back gate bias as well as the stored charge in the back floating gate and vice versa.

Structure of Memory Device with Thin Silicon Body

Figure 19:
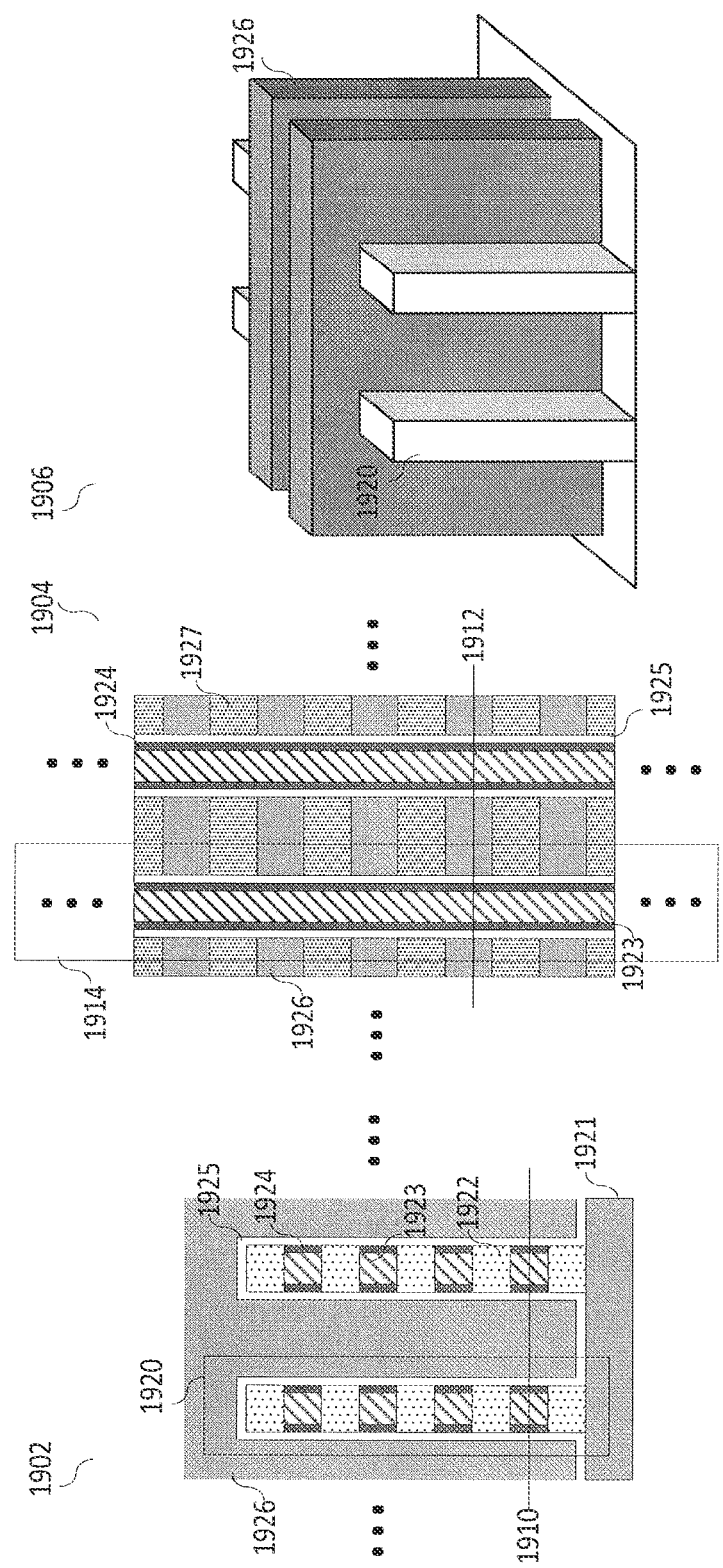
FIG. 19 is a diagram an embodiment of a VG NAND device with thin silicon body.

FIG. 19 is a diagram an embodiment of a VG NAND device with thin silicon body. FIG. 19 provides the vertical structure 1902, horizontal structure 1904, and 3-dimensional structure 1906 of the cell transistor stack. Horizontal structure 1904 shows a longitudinal section of the cell structure cut along dashed line 1910 of the vertical structure 1902. Vertical structure 1902 shows a cross section of the cell structure cut along dashed line 1912 of the horizontal structure 1904. For ease of interpreting the figure, dielectric material 1927 is not shown in the 3-dimensional structure 1906. Each vertical structure 1920 may be fin-shaped running in a first direction horizontal to the chip surface with layers comprising different materials. Each horizontal unit of the fins as defined by the box 1914 may form a NAND cell string. While only two fins are shown, any number of fins may be used in the VG NAND device with varying numbers of layers as determined based upon the needs of the end user, characteristics of the materials used for the device, and/or manufacturing process or the device.

Figure 20:
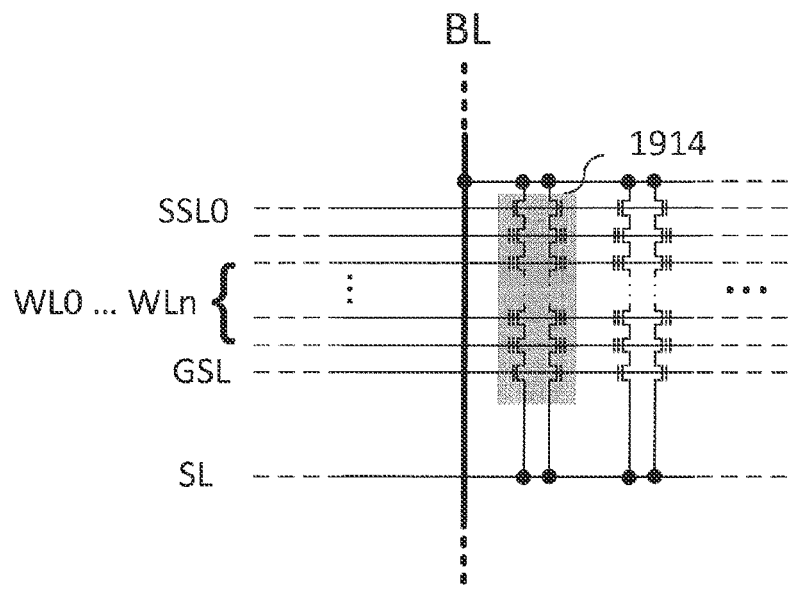
FIG. 20 is a schematic of a circuit formed by the VG NAND device of FIG. 19.

FIG. 20 is a schematic of a circuit formed by the VG NAND device of FIG. 19. In the box 1914 the cell string is shown as a dual string with cell transistors paired up and facing each other to emphasize the dual gate structure of the present embodiment.

Referring back to FIG. 19, the transistor stack may be formed on the silicon chip substrate 1921. Each vertical structure 1920 may consist of alternating layers a first dielectric material 1922 and a second dielectric material 1923. The first dielectric material 1922 may be silicon nitride for example. The second dielectric material 1923 may be a low-k dielectric material like doped or undoped $SiO_2$ with a dielectric constant much lower than silicon. The sidewalls of the second dielectric material 1923 may be laterally recessed relative to the sidewalls of the first dielectric material 1922. On each vertical sidewall of the second dielectric material 1923 there may be a silicon film 1924. As the sidewall surface of the second dielectric material 1923 may be recessed relative to the sidewalls of the first dielectric material 1922, the surface of the silicon film 1924 may not be protruded relative to the sidewall surface of the first dielectric material 1922. The vertical structures 1920 comprising layers 1922, 1923, and 1924 may be covered by a layer 1925. Although not shown in the figures, layer 1925 may be in fact a multilayer structure comprising a tunnel dielectric, a charge trap layer and coupling dielectric for charge storage. For example, the layer 1925 may have an oxide-nitrogen-oxide (O—N—O) structure comprising a silicon oxide film, a silicon nitride film and a silicon oxide film. The vertical structures 1920 comprising layers 1922, 1923, 1924, and 1925 may be wrapped by a conducting gate material 1926 which may be doped poly-Si. The conducting gate material 1926 may not fill the entire space between the fins, but may form a line structure running in a second horizontal direction which is perpendicular to the first horizontal direction. These line structures may form the word lines of the memory device. The space between the word lines may be filled with a dielectric material 1927 like $SiO_2$.

Manufacturing Process of Thin Silicon Body Memory Device

The manufacturing process of the thin silicon body memory device will now be described in conjunction with FIGS. 21 through 27.

Figure 21:
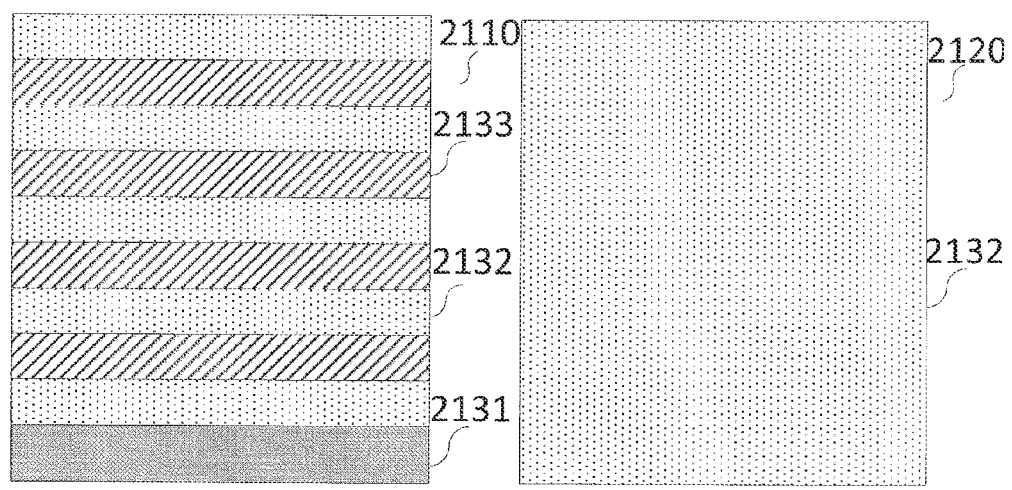
FIG. 21 is a diagram of a vertical cross section and a top view of the first step of the process for manufacturing a thin silicon body memory device according to one embodiment of the disclosure.

FIG. 21 is a diagram of a vertical cross section 2110 and a top view 2120 of the first step of the manufacturing process. In the first step, two different dielectric materials 2132 and 2133 may be stacked on a silicon substrate 2131 in alternating horizontal layers. Dielectric materials 2132 and 2133 may be similar to the first dielectric material 1922 and the second dielectric material 1923 respectively, as shown in FIG. 19. Silicon substrate may be similar to silicon substrate 1921.

Figure 22:
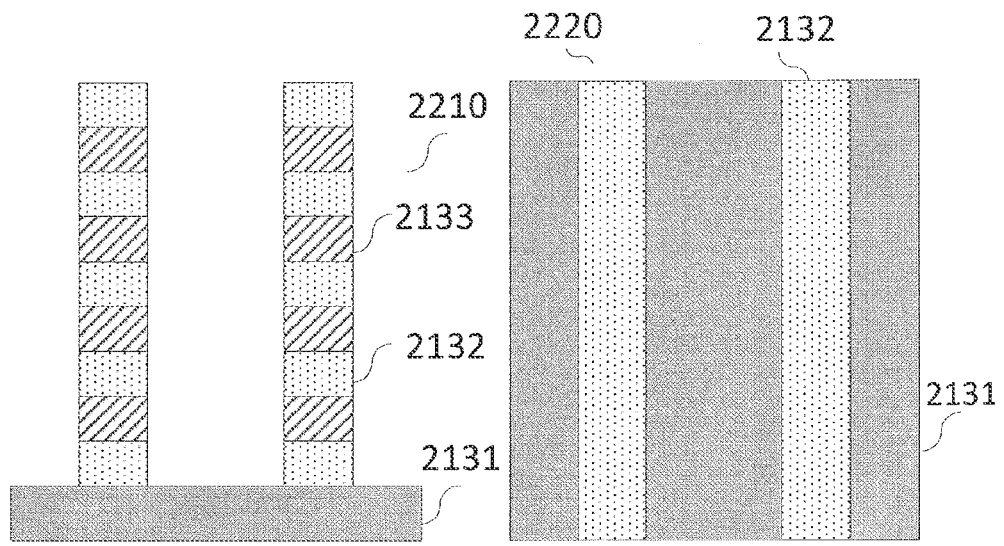
FIG. 22 is a diagram of a vertical cross section and a top view of the second step of the process for manufacturing a thin silicon body memory device according to one embodiment of the disclosure.

FIG. 22 is a diagram of a vertical cross section 2210 and a top view 2220 of the second step of the manufacturing process. In the second step, the stacked dielectric layers 2133, 2132 may be patterned in to fin patterns by anisotropic reactive ion etching (RIE).

Figure 23:
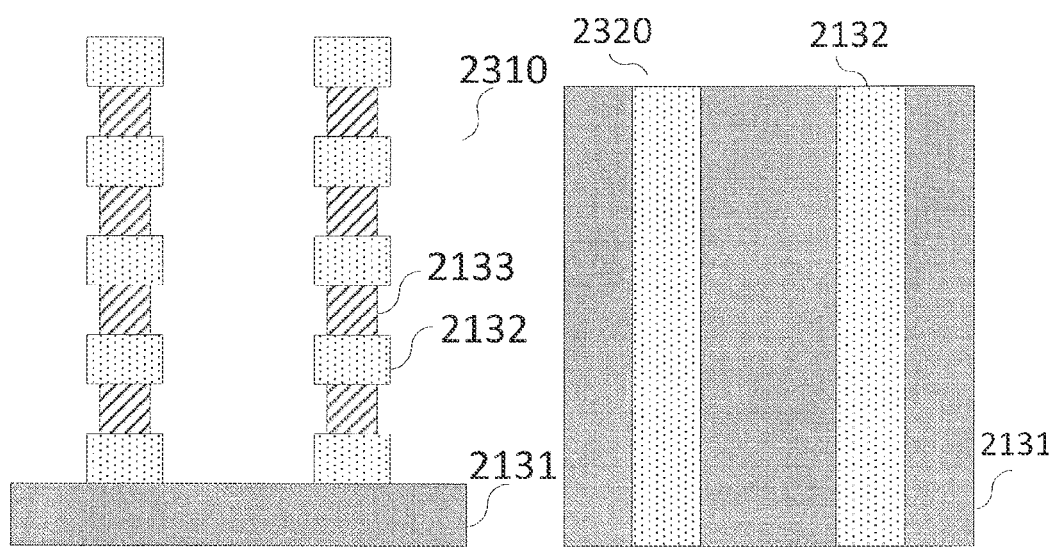
FIG. 23 is a diagram of a vertical cross section and a top view of the third step of the process for manufacturing a thin silicon body memory device according to one embodiment of the disclosure.

FIG. 23 is a diagram of a vertical cross section 2310 and a top view 2320 of the third step of the manufacturing process. In the third step, the sidewall surfaces of the dielectric layers 2133 may be etched back relative to dielectric layer 2132 by selective isotropic RIE. The etching may form alternating recessed sidewall patterns.

Figure 24:
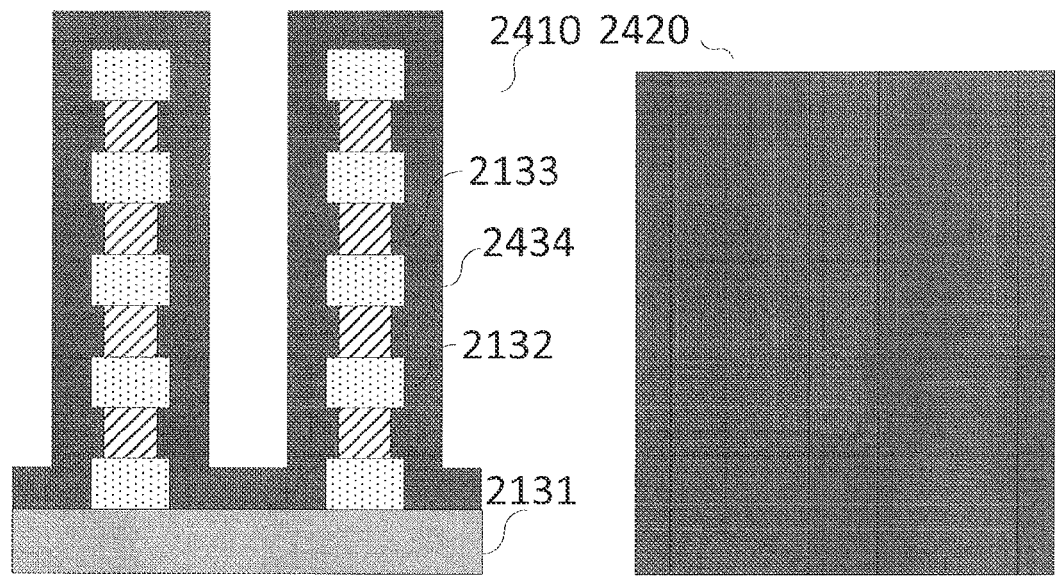
FIG. 24 is a diagram of a vertical cross section and a top view of the fourth step of the process for manufacturing a thin silicon body memory device according to one embodiment of the disclosure.

FIG. 24 is a diagram of a vertical cross section 2410 and a top view 2420 of the fourth step of the manufacturing process. In the fourth step, poly-Si 2434 may be deposited so as to completely cover the vertical structures. The deposited poly-Si 2434 material may form silicon bodies of the cell transistors. Poly-Si 2434 may be similar to the thin silicon film 1924 described in FIG. 19.

Figure 25:
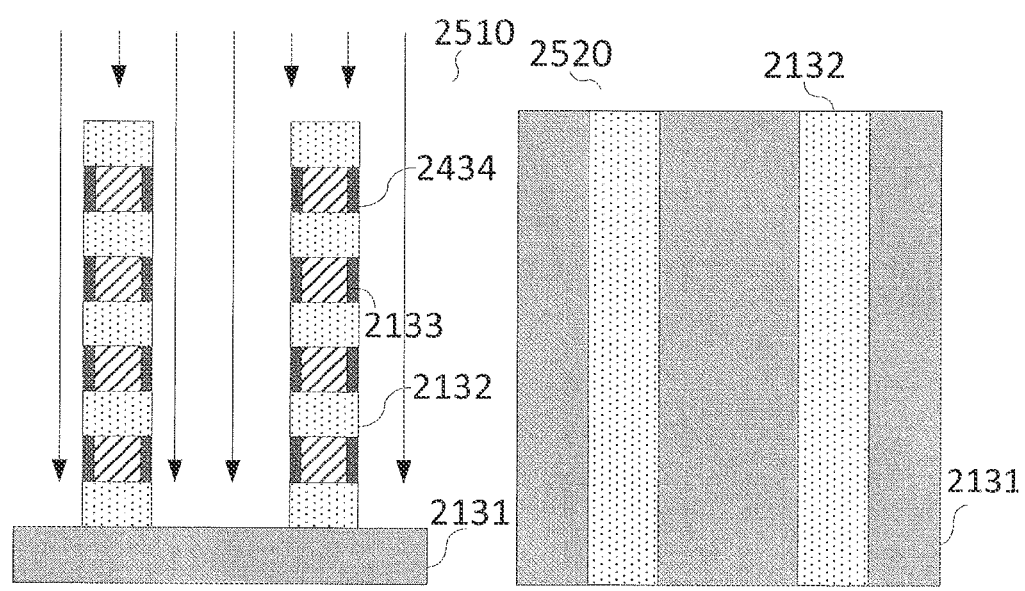
FIG. 25 is a diagram of a vertical cross section and a top view of the fifth step of the process for manufacturing a thin silicon body memory device according to one embodiment of the disclosure.

FIG. 25 is a diagram of a vertical cross section 2510 and a top view 2520 of the fifth step of the manufacturing process. In the fifth step, the poly-Si 2434 layer may be etched back by a directional etch process so as to be completely removed except for the locations which are masked by the protruded sidewalls of dielectric layer 2132. Thus, the poly-Si 2134 fills the spaces which were created by the sidewall recess of step three and only covers the sidewalls of dielectric layers 2133. In some embodiments, the direction etch process may be followed by a isotropic selective etch to further etch back the poly-Si layer.

Figure 26:
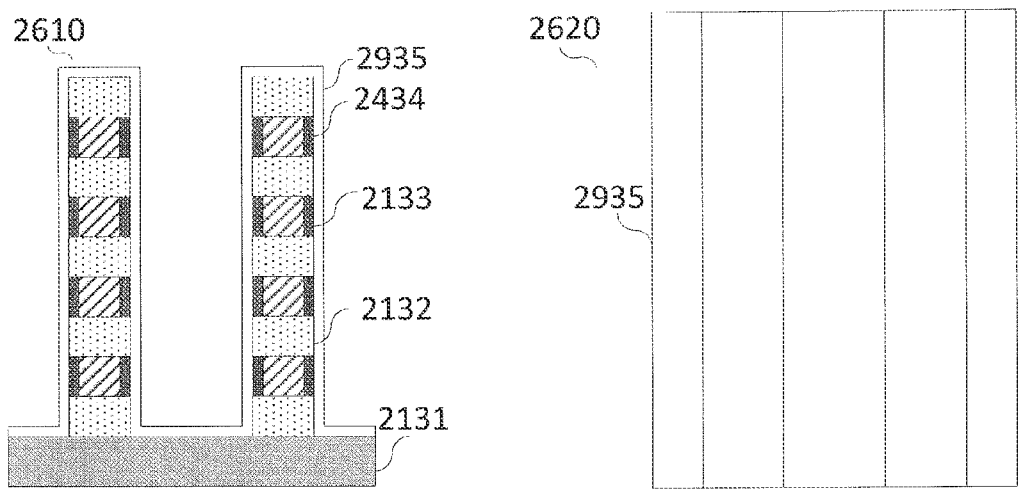
FIG. 26 is a diagram of a vertical cross section and a top view of the sixth step of the process for manufacturing a thin silicon body memory device according to one embodiment of the disclosure.

FIG. 26 is a diagram of a vertical cross section 2610 and a top view 2610 of the sixth step of the manufacturing process. In the sixth step, dielectric multilayer 2635 may be deposited. Dielectric multilayer 2635 may be similar to layer 1925 described in FIG. 19.

Figure 27:
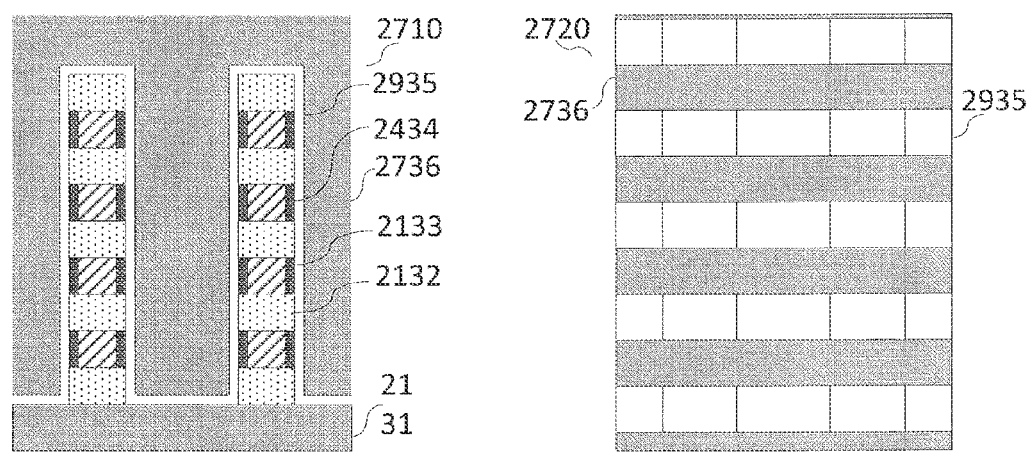
FIG. 27 is a diagram of a vertical cross section and a top view of the seventh step of the process for manufacturing a thin silicon body memory device according to one embodiment of the disclosure.

FIG. 27 is a diagram of a vertical cross section 2710 and a top view 2720 of the seventh step of the manufacturing process. In the seventh step, gate material 2736 may be deposited and patterned into stripe patterns which comprise the word lines. Finally, the remaining space between the word lines may be filled with a dielectric material similar to dielectric 1927. Gate material 2736 may be similar to gate material 1926 of FIG. 19.

The method described above for manufacturing thin film poly-Si on a VG NAND architecture may reduce errors related to uncontrollable trap charges by not relying on lithography limited additional patterning of the stack structures. Further the method may not be sensitive to etch slopes experiences when an Si-body is thinned by a directional etch process which divides the stack architecture.

Further, using the method described above, the current paths of the strings on opposite faces of the same vertical structure may be completely isolated from each other. This isolation opens the possibility for independent data storage on each side of the dual gate structure, resulting in density increase of the memory.

In previous VG NAND structures which comprised silicon bodies without a dielectric material between each face of the dual gate coupling of channels to a back gate occurs because silicon has a relatively high dielectric constant of 11.6, whereas the dielectric constant of undoped SiO2 has a dielectric constant around 3.9. The capacitive coupling of the strings may be greatly reduced using the method described above.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Unless otherwise stated, the term "about" shall mean plus or minus 10 percent of the subsequent value. Moreover, any numerical range defined by two R numbers as defined in the above is also specifically disclosed. Use of the term "optionally" with respect to any element of a claim means that the element is required, or alternatively, the element is not required, both alternatives being within the scope of the claim. Use of broader terms such as comprises, includes, and having should be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure.

The embodiments described herein are examples of structures, systems or methods having elements corresponding to elements of the techniques of this application. This written description may enable those skilled in the art to make and use embodiments having alternative elements that likewise correspond to the elements of the techniques of this application. The intended scope of the techniques of this application thus includes other structures, systems or methods that do not differ from the techniques of this application as described herein, and further includes other structures, systems or methods with insubstantial differences from the techniques of this application as described herein.

While several embodiments have been provided in the present disclosure, it should be understood that the disclosed systems and methods may be embodied in many other specific forms without departing from the scope of the present disclosure. The present examples are to be considered as illustrative and not restrictive, and the intention is not to be limited to the details given herein. For example, the various elements or components may be combined or integrated in another system or certain features may be omitted, or not implemented.

Also, techniques, systems, subsystems and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component, whether electrically, mechanically, or otherwise. Other examples of changes, substitutions, and Alterations are ascertainable by one skilled in the art and may be made without departing from the spirit and scope disclosed herein.

What is claimed is:

1. A method for forming a first memory stack in fabrication of a nonvolatile memory device, the method comprising:
    depositing a first dielectric layer above an upper surface of a semiconductor substrate;
    depositing a second dielectric layer of a material different from the first dielectric layer above the first dielectric layer;
    carrying out anisotropic etching of the second dielectric layer and the first dielectric layer sequentially, so as to create a first dielectric pattern and a second dielectric pattern above the first dielectric pattern;
    carrying out isotropic etching of the first and second dielectric patterns, and the isotropic etching for the first dielectric pattern is at a higher etch rate than the isotropic etching for the second dielectric layer, and the isotropic etching removing at least a portion of the first dielectric pattern and forming at least one undercut space under the second dielectric pattern;
    depositing a first film of a conducting or a semiconducting material at least on a sidewall of the second dielectric pattern and in the at least one undercut space;
    carrying out dry etching in a manner so as to remove the first film from the sidewall of the second dielectric pattern and to leave the first film in the at least one undercut space;
    depositing a third dielectric layer over at least a sidewall of the first film; and
    depositing a second film of a conducting or a semiconducting material over the third dielectric layer, so that a topmost portion of the second film is at a location higher than a topmost portion of the second dielectric pattern and a bottom-most portion of the second film is at a lower location that the first film.

2. The method of claim 1, wherein a second memory stack adjacent to the first memory stack is formed at same actions as for forming of the first memory stack, and the second memory stack having a structure at least substantially identical to the first memory stack.

3. The method of claim 2, wherein the second film is deposited to fill a space between the first and the second memory stack.

4. The method of claim 2, wherein the carrying out of the isotropic etching does not remove the first dielectric pattern entirely, so that a part of the first dielectric pattern remains under the second dielectric pattern after the carrying out of the isotropic etching.

5. The method of claim 2, wherein the first film is comprised of polysilicon.

6. The method of claim 2, wherein the first film extends continuously in a first direction horizontal to an upper surface of the semiconductor substrate.

7. The method of claim 2, wherein the second film extends continuously in a second direction perpendicular to the first direction.

8. The method of claim 2, wherein the first dielectric layer is made of a material with a dielectric constant lower than a dielectric constant of the second dielectric layer.

9. The method of claim 8, wherein the first dielectric layer is made of silicon oxide, and the second dielectric layer is made of silicon nitride.

10. The method of claim 2, wherein before the depositing of the first film:
    i) a third dielectric pattern is formed on the second dielectric pattern; and
    ii) a fourth dielectric pattern is formed on the third dielectric pattern, and the third dielectric pattern being of a same material as the first dielectric pattern, and the fourth dielectric pattern being of a same material as the second dielectric pattern.

11. The method of claim 2, wherein the first film left in the at least one undercut space has a thickness in a direction parallel to the upper surface of the semiconductor substrate which is smaller than a height in a direction perpendicular to the upper surface of the semiconductor substrate.

12. The method of claim 1, wherein the carrying out of the isotropic etching does not remove the first dielectric pattern entirely, so that a part of the first dielectric pattern remains under the second dielectric pattern after the carrying out of the isotropic etching.

13. The method of claim 1, wherein the first film is comprised of polysilicon.

14. The method of claim 1, wherein the first film extends continuously in a first direction horizontal to an upper surface of the semiconductor substrate.

15. The method of claim 1, wherein the second film extends continuously in a second direction perpendicular to the first direction.

16. The method of claim 1, wherein the first dielectric layer is made of a material with a dielectric constant lower than a dielectric constant of the second dielectric layer.

17. The method of claim 16, wherein the first dielectric layer is made of silicon oxide, and the second dielectric layer is made of silicon nitride.

18. The method of claim 1, wherein before the depositing of the first film:
   i) a third dielectric pattern is formed on the second dielectric pattern; and
   ii) a fourth dielectric pattern is formed on the third dielectric pattern, and the third dielectric pattern being of a same material as the first dielectric pattern, and the fourth dielectric pattern being of a same material as the second dielectric pattern.

19. The method of claim 1, wherein the first film left in the at least one undercut space has a thickness in a direction parallel to the upper surface of the semiconductor substrate which is smaller than a height in a direction perpendicular to the upper surface of the semiconductor substrate.

* * * * *